(12) United States Patent
Wang

(10) Patent No.: US 7,012,293 B2
(45) Date of Patent: Mar. 14, 2006

(54) FABRICATING AN SRAM CELL

(75) Inventor: Zhongze Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 10/379,480

(22) Filed: Mar. 4, 2003

(65) Prior Publication Data

US 2004/0173834 A1 Sep. 9, 2004

(51) Int. Cl.
*H01L 29/76* (2006.01)

(52) U.S. Cl. ...................................... 257/300
(58) Field of Classification Search ................ 257/368, 257/369, 390, 393
See application file for complete search history.

(56) References Cited

U.S. PATENT DOCUMENTS 5,742,078 A * 4/1998 Lee et al. .................... 257/202

6,169,313 B1 * 1/2001 Tsutsumi et al. ........... 257/390
2002/0135021 A1 * 9/2002 Karasawa et al. .......... 257/369

* cited by examiner

*Primary Examiner*—David Nelms
*Assistant Examiner*—Thao P. Le
(74) *Attorney, Agent, or Firm*—Williams, Morgan and Amerson

(57) ABSTRACT

The present invention provides an improved SRAM cell design. The SRAM cell includes a first active area on oxide in a first conductive well located on a first vertical side of the SRAM cell, a second active area on oxide in a second conductive well located on the first vertical side of the SRAM cell, a third active area on oxide in the first conductive well located on a second vertical side of the SRAM cell, a fourth active area on oxide in the second conductive well located on the second vertical side of the SRAM cell, a first gate located on the first vertical side of the SRAM cell, a second gate located on the second vertical side of the SRAM cell, a first local interconnect connecting the first active area, the second active area, and the second gate via a second EC contact located on the second gate, and a second local interconnect connecting the third active area, the fourth active area, and the first gate via a first EC contact located on the first gate.

54 Claims, 13 Drawing Sheets

FABRICATING AN SRAM CELL

BACKGROUND OF THE INVENTION

1. Field of the Invention

This invention relates generally to a semiconductor memory device, and, more specifically, to a fabrication of a static random access memory ("SRAM") cell.

2. Description of the Related Art

Semiconductor memory devices have been well-known for many years. Such devices are typically one of two types: volatile memory devices, such as dynamic random access memories (hereinafter "DRAMs"), and non-volatile memory devices, such as static random access memories (hereinafter "SRAMs"). Volatile memory devices will store an electrical charge (hereinafter "EC") only for a very short period of time, and the electrical charge in the cells must be periodically refreshed. Non-volatile memory devices will normally store data for an indefinite period of time once the data has been written into the memory cells. The cells are designed such that the electrical charge placed in the cell will remain in the cell indefinitely under appropriate conditions. The indefinite storage of the electrical charge is an advantage of the non-volatile memories. The SRAM is a significant memory device due to its high speed, low power consumption, and simple operation. SRAMs are generally used in applications requiring high speed operations, such as a cache memory for a data processing system.

An SRAM chip is conventionally structured in rows and columns of individual SRAM cells. SRAM memory cells are generally comprised of four or six transistor memory cells. A conventional SRAM cell comprises a plurality of word lines and a plurality of pairs of complementary bit lines. Data is read from or written into a selected SRAM cell via the pairs of bit lines. Power may be provided to the SRAM memory cell by a collector common voltage or $V_{cc}$.

A goal for SRAM cells in an integrated circuit is a compact layout of transistors and interconnects, but the layout should allow for alignment errors during manufacture and provide isolation between active regions. Additionally, manufacturing should achieve a high yield of operable integrated circuits using a relatively simple process that minimizes manufacturing steps to reduce cost. The layout should provide a robust cell that has minimum junction capacitance and leakage. The layout should also be fast and not subject to errors that came a stored value to erroneously change. For example, reducing the soft error rate (hereinafter "SER") of a SRAM cell is generally advantageous. SER refers to the upset of data in memory caused by cosmic rays and background radioactive material. Soft errors are potentially harmful to users. A soft error in memory may cause networking equipment to send information packets, such as money transfers, to the wrong address. The layout should also have minimum junction capacitance and leakage. The industry is lacking an efficient memory layout that provides efficient packaging of memory, reduced current leakage, reduced error, etc.

The present invention eliminates or, at least, reduces the aforementioned problems.

SUMMARY OF THE INVENTION

In one aspect of the present invention, a memory device that comprises an improved memory cell is provided. The memory cell includes a first active area on oxide in a first conductive well located on a first vertical side of the memory cell, a second active area on oxide in a second conductive well located on the first vertical side of the memory cell, a third active area on oxide in the first conductive well located on a second vertical side of the memory cell, a fourth active area on oxide in the second conductive well located on the second vertical side of the memory cell, a first gate located on the first vertical side of the memory cell, a second gate located on the second vertical side of the memory cell, a first local interconnect connecting the first active area, the second active area, and the second gate via a second EC contact located on the second gate, and a second local interconnect connecting the third active area, the fourth active area, and the first gate via a first EC contact located on the first gate.

In another aspect of the present invention, an improved SRAM cell design is provided. The SRAM includes a first active area on oxide in a first conductive well located on a first vertical side of the SRAM cell, a second active area on oxide in a second conductive well located on the first vertical side of the SRAM cell, a third active area on oxide in the first conductive well located on a second vertical side of the SRAM cell, a fourth active area on oxide in the second conductive well located on the second vertical side of the SRAM cell, a first gate located on the first vertical side of the SRAM cell, a second gate located on the second vertical side of the SRAM cell, a first local interconnect connecting the first active area, the second active area, and the second gate via a second EC contact located on the second gate, and a second local interconnect connecting the third active area, the fourth active area, and the first gate via a first EC contact located on the first gate.

In another aspect of the present invention, an improved SRAM cell design is provided. The SRAM cell includes a first active area on oxide in a first and second conductive well located on a first vertical side of the SRAM cell, a second active area on oxide in the first and second conductive well located on the second vertical side of the SRAM cell, a first gate located on the first vertical side of the SRAM cell, a second gate located on the second vertical side of the SRAM cell, a first local interconnect connecting the first active area and the second gate via a second EC contact located on the second gate, and a second local interconnect connecting the second active area to the first gate via a first EC contact located on the first gate, wherein the first gate and second gate comprise parasitic capacitors.

In another aspect of the present invention, an improved SRAM cell design is provided. The SRAM cell includes a first shared standard contact located in a first conductive well on a first vertical side of the SRAM cell, a second shared standard contact located in the first conductive well on a second vertical side of the SRAM cell and a first metal interconnect connecting the first shared standard contact and the second shared standard contact. The SRAM cell further provides a third shared standard contact located in a second conductive well on the first vertical side of the SRAM cell, a fourth shared standard contact located in the second conductive well on the second vertical side of the SRAM cell and a second metal interconnect connecting the third shared standard contact and the fourth shared standard contact. The SRAM cell further provides a first standard contact located on a first gate in the second conductive well, a second standard contact located on a second gate in the first conductive well, a third standard contact located on a first active area on oxide in a first conductive well and a fourth standard contact located on a second active area on oxide in a second conductive well. The SRAM cell further provides a third metal interconnect connecting the first standard contact and the fourth standard contact, and a fourth metal interconnect connecting the second standard contact and the third standard contact.

In another aspect of the present invention, a system that comprises an improved memory cell is provided. The system comprises a memory unit that includes the memory cell. The memory cell includes a first active area on oxide in a first conductive well located on a first vertical side of the memory cell, a second active area on oxide in a second conductive well located on the first vertical side of the memory cell, a third active area on oxide in the first conductive well located on a second vertical side of the memory cell, a fourth active area on oxide in the second conductive well located on the second vertical side of the memory cell, a first gate located on the first vertical side of the memory cell, a second gate located on the second vertical side of the memory cell, a first local interconnect connecting the first active area, the second active area, and the second gate via a second EC contact located on the second gate, and a second local interconnect connecting the third active area, the fourth active area, and the first gate via a first EC contact located on the first gate. The system also comprises an access unit coupled to the memory unit. The access unit is capable of accessing at least a portion of the memory in the memory unit.

In yet another aspect of the present invention, a method is provided for forming a memory device that comprises an improved memory cell is provided. A first active area is formed on oxide in a first conductive well located on a first vertical side of the memory cell. A second active area is formed on oxide in a second conductive well located on the first vertical side of the memory cell. A third active area is formed on oxide in the first conductive well located on a second vertical side of the memory cell. A fourth active area is formed on oxide in the second conductive well located on the second vertical side of the memory cell. A first gate is formed on the first vertical side of the memory cell. A second gate is formed on the second vertical side of the memory cell. A first local interconnect is formed to connect the first active area, the second active area, and the second gate via a second EC contact located on the second gate. A second local interconnect is formed to connect the third active area, the fourth active area, and the first gate via a first EC contact located on the first gate.

In another aspect of the present invention, a system board that comprises an improved memory cell is provided. The system board comprises a processor. The system board also comprises a memory unit that includes a memory cell. The memory cell includes a first active area on oxide in a first conductive well located on a first vertical side of the memory cell, a second active area on oxide in a second conductive well located on the first vertical side of the memory cell, a third active area on oxide in the first conductive well located on a second vertical side of the memory cell, a fourth active area on oxide in the second conductive well located on the second vertical side of the memory cell, a first gate located on the first vertical side of the memory cell, a second gate located on the second vertical side of the memory cell, a first local interconnect connecting the first active area, the second active area, and the second gate via a second EC contact located on the second gate, and a second local interconnect connecting the third active area, the fourth active area, and the first gate via a first EC contact located on the first gate. The system also comprises an access unit coupled to the memory unit. The access unit is capable of accessing at least a portion of the memory in the memory unit.

BRIEF DESCRIPTION OF THE DRAWINGS

The invention may be understood by reference to the following description taken in conjunction with the accompanying drawings, in which like reference numerals identify like elements, and in which.

Figure 1:
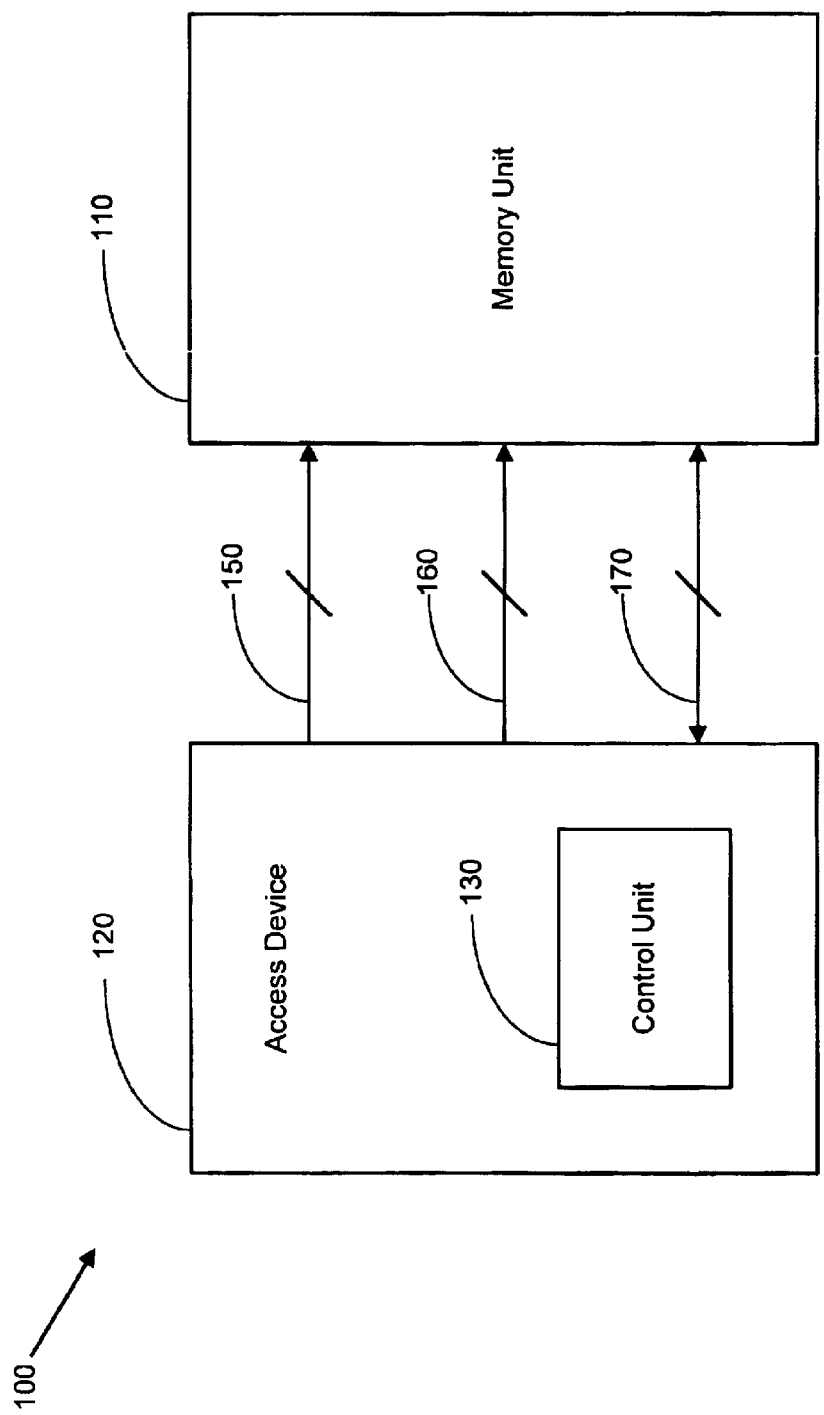
FIG. 1 is a block diagram of a system including a device that is capable of accessing and/or testing a memory, in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a block diagram of a system 100 is illustrated, in accordance with one embodiment of the present invention. The system 100 comprises a memory unit 110 capable of storing data, which may be accessed by an access device 120. The access device 120 comprises a control unit 130 capable of accessing data stored in the memory unit 110. The access device 120 may be any device that uses the memory unit 110 to store data, read data, or both. Examples of the access device 120 may include, but are not limited to, a computer, a camera, a telephone, a television, a radio, a calculator, a personal digital assistant, a network switch, a setup-box, and the like.

The control unit 130, in one embodiment, may manage the overall operations of the access device 120, including writing and reading data to and from the memory unit 110. The control unit 130 may comprise a microprocessor, a microcontroller, a digital signal processor, a processor card (including one or more microprocessors or controllers), a memory controller, or other control or computing devices.

Figure 2:
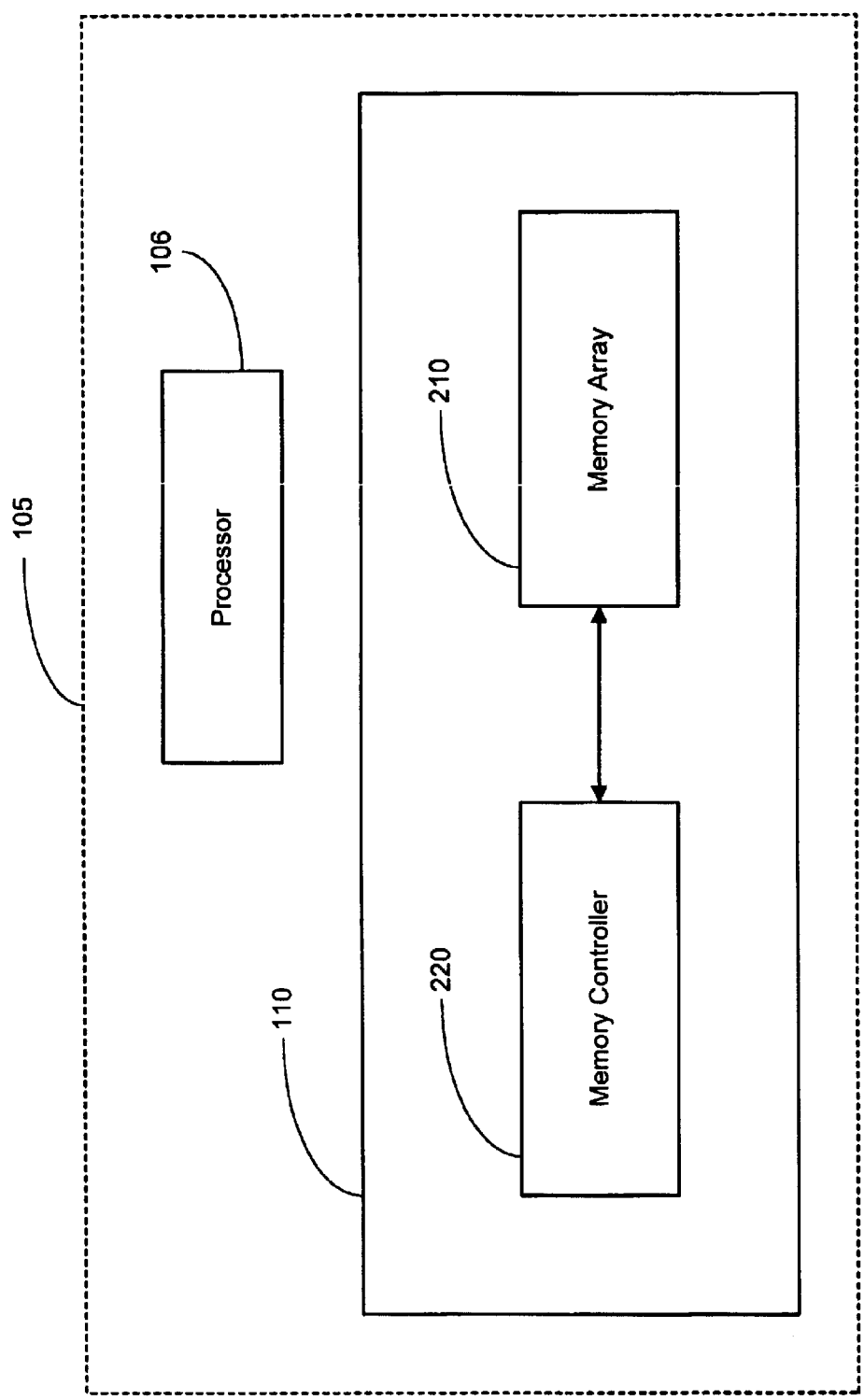
FIG. 2 is a block diagram of the memory unit of FIG. 1, in accordance with one illustrative embodiment of the present invention.

The memory unit 110 in the illustrated embodiment is a non-volatile memory, such as flash memory. In one embodiment, the memory unit 110 may be an external memory, such as a memory stick, and may be accessed when inserted into a slot (not shown) of the access device 120. When inserted into the access device 120, the access device 120 provides the appropriate power and control signals to access memory locations in the memory unit 110. The memory unit 110 may be external to, or internal (e.g., integrated) to, the access device 120. The access device 120, such as a computer system, may employ a memory unit 110 that is integrated within the computer system to store data (e.g., BIOS [basic input/output system]) related to the computer system. The memory unit 110 may be a static random access memory (SRAM) device. As shown in FIG. 2, the memory unit 110 may be part of a system board 105 that includes a processor 106. The system board 105 may be a motherboard that is utilized in a variety of types of computer systems, such as an IBM compatible computer system, a workstation computer system, a mainframe computer system, an Apple computer system, and the like.

Turning now to FIG. 2, a block diagram representation of the memory unit 110 of FIG. 1 is illustrated. In one embodiment, the memory unit 110 may be a static random access memory (hereinafter "SRAM"). The memory unit 110 may comprise a memory array 210 and a memory controller 220. The memory array 210 may contain one or more memory cells (not shown). In one embodiment, the access device 120 of FIG. 1 may access the memory unit 110 via a memory controller 220. Referring again to FIG. 1, the memory unit 110 may receive control signals across control lines 150 from the control unit 130 to control access to the memory array 210 of FIG. 2. Access to the memory array 210 may be directed to the one or more memory cells in response to address signals received across address lines 160. Once accessed, data from the memory array 210 may be written to or read from the memory array 210 across data lines 170.

Figure 3:
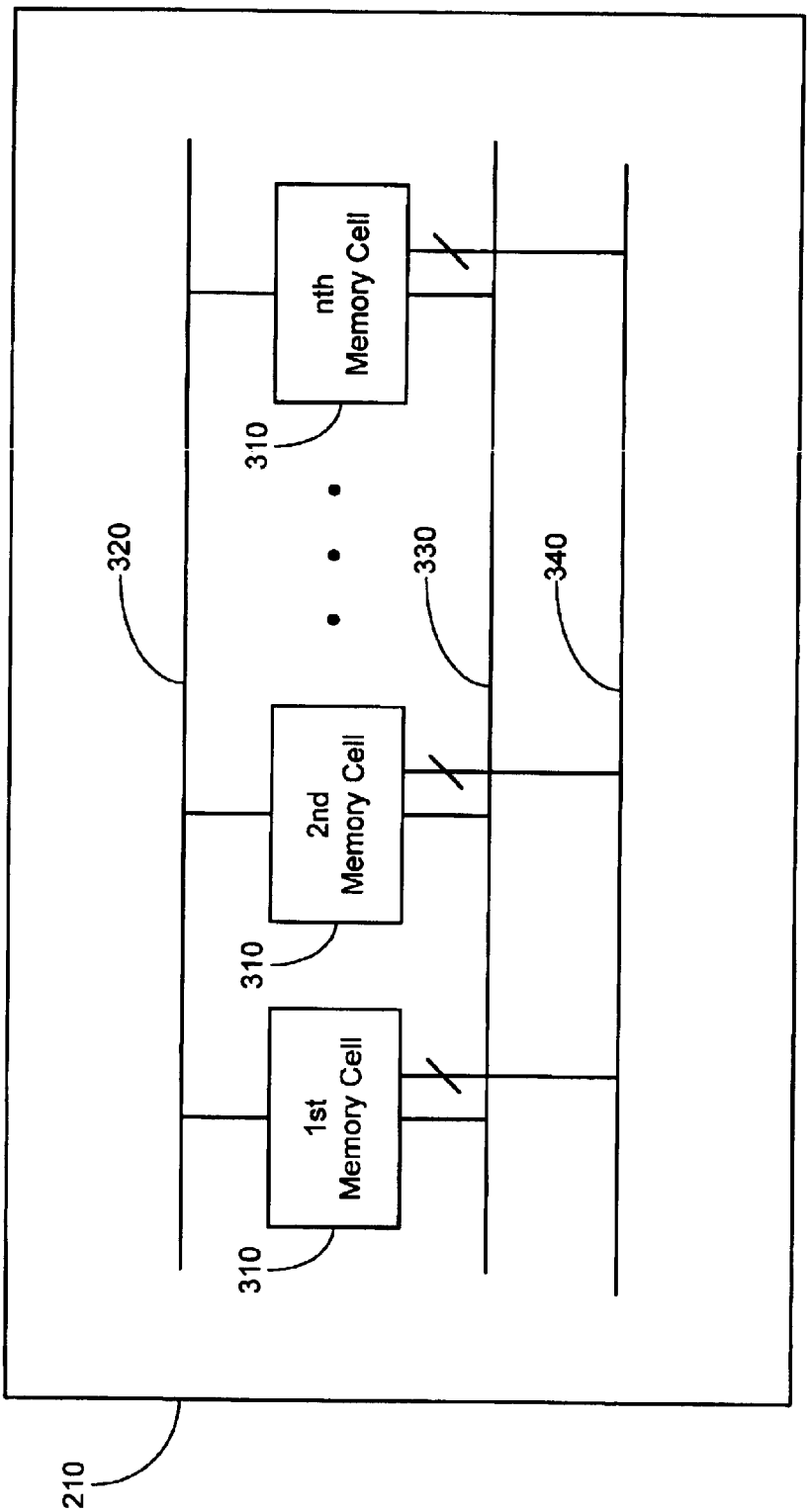
FIG. 3 is a block diagram of the memory array of FIG. 2, in accordance with one illustrative embodiment of the present invention.

Referring to FIG. 3, a block diagram of the memory array 210 of FIG. 1 in accordance with one illustrative embodiment of the present invention is illustrated. The memory array 210 may comprise a plurality of memory cells 310 (e.g., a first through $n^{th}$ memory cell 310). Each memory cell 310 contains a unit of data, such as a bit, which can be entered, stored, and/or retrieved by the access device 120 of FIG. 1, for example. Data may be stored, for example, on two cross-coupled inverters that serve as a data latch. The memory cells 310 are powered by a collector common-voltage, or $V_{cc}$, 320. The ground connection is $V_{ss}$ 330.

The memory cells 310 are operatively coupled to one or more access lines 340. The access lines 340 may include wordlines, bitlines, and other signals known to those skilled in the art. Two bitline signals generally complement each wordline signal. Data may be read or written through the bitlines. The wordlines select which specific memory cell 310 to be written or read.

As discussed in greater detail below, the present invention comprises a novel SRAM cell design, which provides, in its various embodiments, numerous advantages over known SRAM cell designs, such as the conventional 6T CMOS SRAM. It should be appreciated that not all embodiments may provide all the advantages listed. Furthermore, additional advantages not listed may be known to those skilled in the art.

Figure 4:
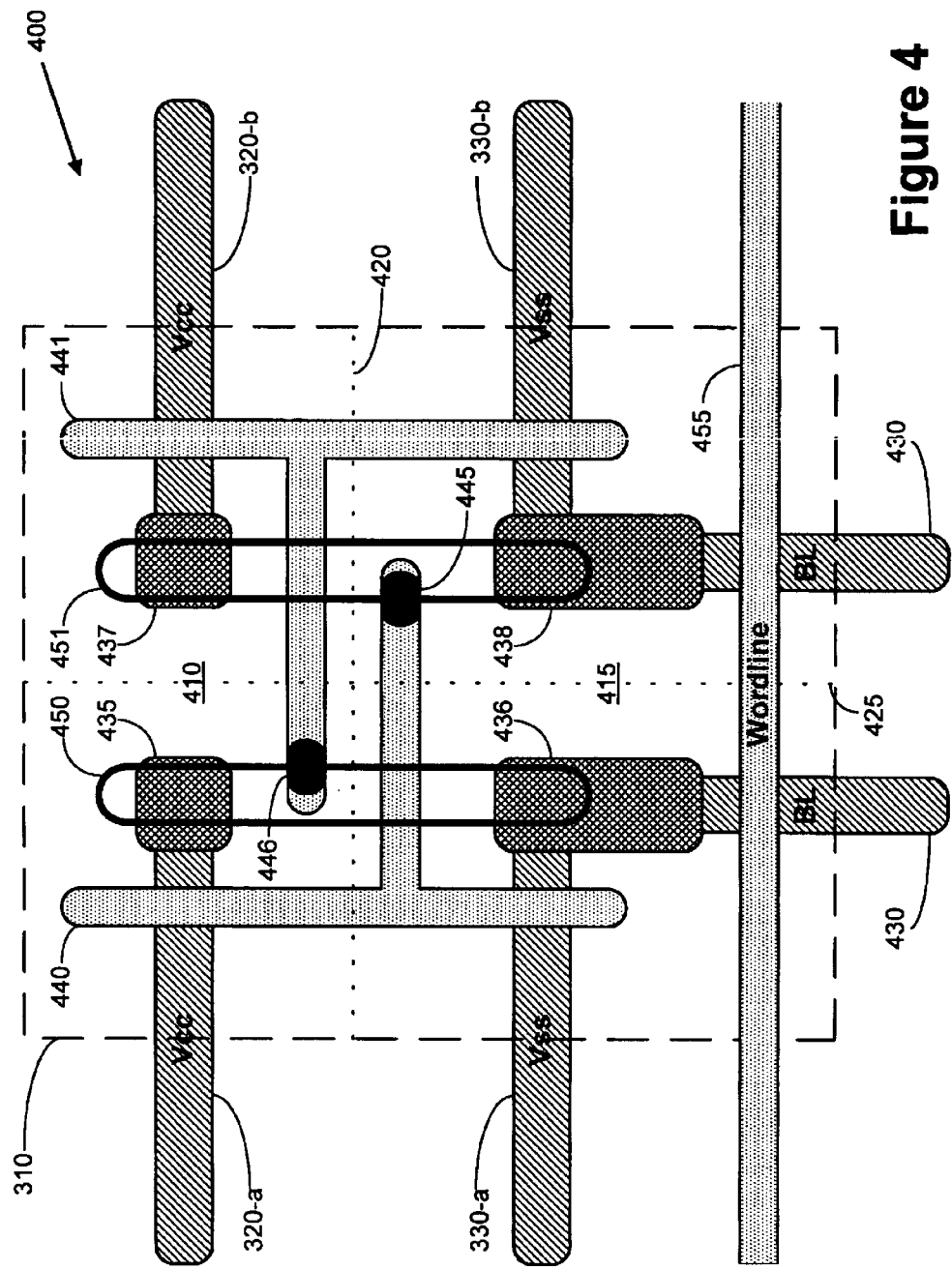
FIG. 4 illustrates a plan view of the memory cell of FIG. 3, in accordance with one illustrative embodiment of the present invention.

Various embodiments of a SRAM cell structure are illustrated in FIGS. 4 to 7. FIG. 4 illustrates a SRAM cell layout 400, in accordance with a first embodiment of the present invention. Although only one SRAM cell 310 is illustrated in the SRAM cell layout 400 it should be appreciated that an SRAM chip may comprise a plurality of SRAM cells 310. The SRAM cell layout 400 comprises a first conductive well 410 and a second conductive well 415, which may be located on standard trench isolation ("STI") oxide formed on a silicon substrate. The terms "first conductive well" and "second conductive well" refer to opposite conductivity types such as a p-well or an n-well, however, those skilled in the art having the benefit of the present disclosure would appreciate that each embodiment described and illustrated herein includes its complementary embodiment as well. In the illustrated embodiment, the first conductive well 410 and the second conductive well 415 are separated by a first dotted line 420. The first conductive well 410 comprises two $V_{cc}$ voltage supply regions 320-a, 320-b. The $V_{cc}$ voltage supply regions 320-a, 320-b define a p-active area on silicon substrate. The second conductive well 415 comprises two $V_{ss}$ 330-a, 330-b ground voltage regions and two bitline contacts 430. The $V_{ss}$ 330-a, 330-b ground voltage regions and bitline contacts 430 define an n-active area on silicon substrate.

Above the $V_{cc}$ voltage supply regions 320-a, 320-b and $V_{ss}$ ground voltage regions 330-a, 330-b are a first active area on an oxide region 435, a second active area on an oxide region 436, a third active area on an oxide region 437, and a fourth active area on an oxide region 438 (may be referred to as "active areas on oxide"). The first active area on oxide region 435 is located in a first vertical region in the first conductive well 410 of the SRAM cell 310, as shown on the left side of a second dotted line 425. The third active area on oxide region 437 is located in a second vertical region in the first conductive well 410, as shown in the right side of the second dotted line 425. The second active area on oxide 436 is located on the first vertical region in the second conductive well 415 of the SRAM cell 310, as shown on the left side of the second dotted line 425. The fourth active area on oxide region 437 is located in the second vertical region in the second conductive well 415, as shown on the right side of the second dotted line 425. The active areas on oxide regions 435–438 may be drain or source regions over the oxide. A p+ drain or source is generally present in an n-well. Likewise, an n+ drain or source is generally present in a p-well. For example, if the first conductive well 410 is an n-well, then the first and third active areas 435, 437 on oxide regions form p+ drain or source regions, and the third and fourth active areas on oxide regions 436, 438 form n+ drain, or source regions. The active areas on oxide regions 435–438 are generally filled with epitaxial silicon or polysilicon over the oxide. A first gate 440 and a second gate 441 (collectively known as "gates") are formed above the active areas on oxide 435–438. FIG. 4 illustrates the two T-shaped gates 440, 441 on the opposing vertical regions of the SRAM cell 310. The first gate 440 may be formed on the same vertical region of the SRAM cell 310 as the first and the third active areas on oxide regions 435, 437. The second gate 441 may be formed on the same vertical region of the SRAM cell 310 as the second and the fourth active areas on oxide regions 436, 438. The gates 440, 441 may comprise a plurality a layers of various materials known to those skilled in the art having the benefit of the present disclosure. For example, the gates 440, 441 may comprise a polysilicon layer, a conductive layer such as tungsten, and a dielectric layer such as nitride.

As shown in FIG. 4, a first EC contact 445 and a second EC contact 446 (collectively known as "EC contacts") may be formed on the gates 440, 441. The first EC contact 445 may be formed on the first gate 440. The second EC contact 446 may be formed on the second gate 441. Contact openings (not shown) are formed by removing the layer of dielectric material on the gates 440, 441 thereby exposing the conductive layer therebeneath. The EC contacts 445, 446 are formed by filling the contact openings with interlayer dielectric material, such as oxide.

A first local interconnect 450 and a second local interconnect 451 (collectively known as "local interconnects") may be formed above the EC contacts 445, 446 and on the same layer as the gates 440, 441. It is appreciated that the local interconnects 450, 451 bypass the gates 440, 441 at regions where the local interconnects 450, 451 may overlap the gates 440, 441. The first local interconnect 450 overlaps the first gate 440. The second local interconnect 451 overlaps the second gate 441. In one embodiment, the local interconnects 450, 451 are comprised of tungsten "slots," as is commonly known in the art. The local interconnects 450, 451 are self-aligned, meaning contacts from the local interconnects 450, 451 to the gates 440, 441 are made only where EC contacts 445, 446 are exposed. The first local interconnect 450 is self-aligned at the second EC contact 446. The second local interconnect 451 is self-aligned at the first EC contact 445. The local interconnects 450, 451 may further provide borderless contacts. The first local interconnect 450 effectively cross-couples the first active area on oxide 435, the second active area on oxide 436, to the second gate 441 via the second EC contact 446. The second local interconnect 451 effectively cross-couples the third active area on oxide 437, the fourth active area on oxide 438, to the first gate 440 via the first EC contact 445. It should be appreciated that a wordline 455 may be associated with the SRAM cell 310 as is common in the art. Furthermore, although not so illustrated, two bitlines may be attached to the SRAM cell 310 via the complimentary bitline contacts 430.

Among a plurality of advantages known to one of ordinary skill in the art having benefit of the present disclosure, the SRAM cell 310 provides a reduction or elimination of junction capacitance beneath the source/drain region. Junction leakage may also be reduced or eliminated. The lower junction capacitance and lower junction leakage may result in faster switching speeds and lower power consumption.

Figure 5:
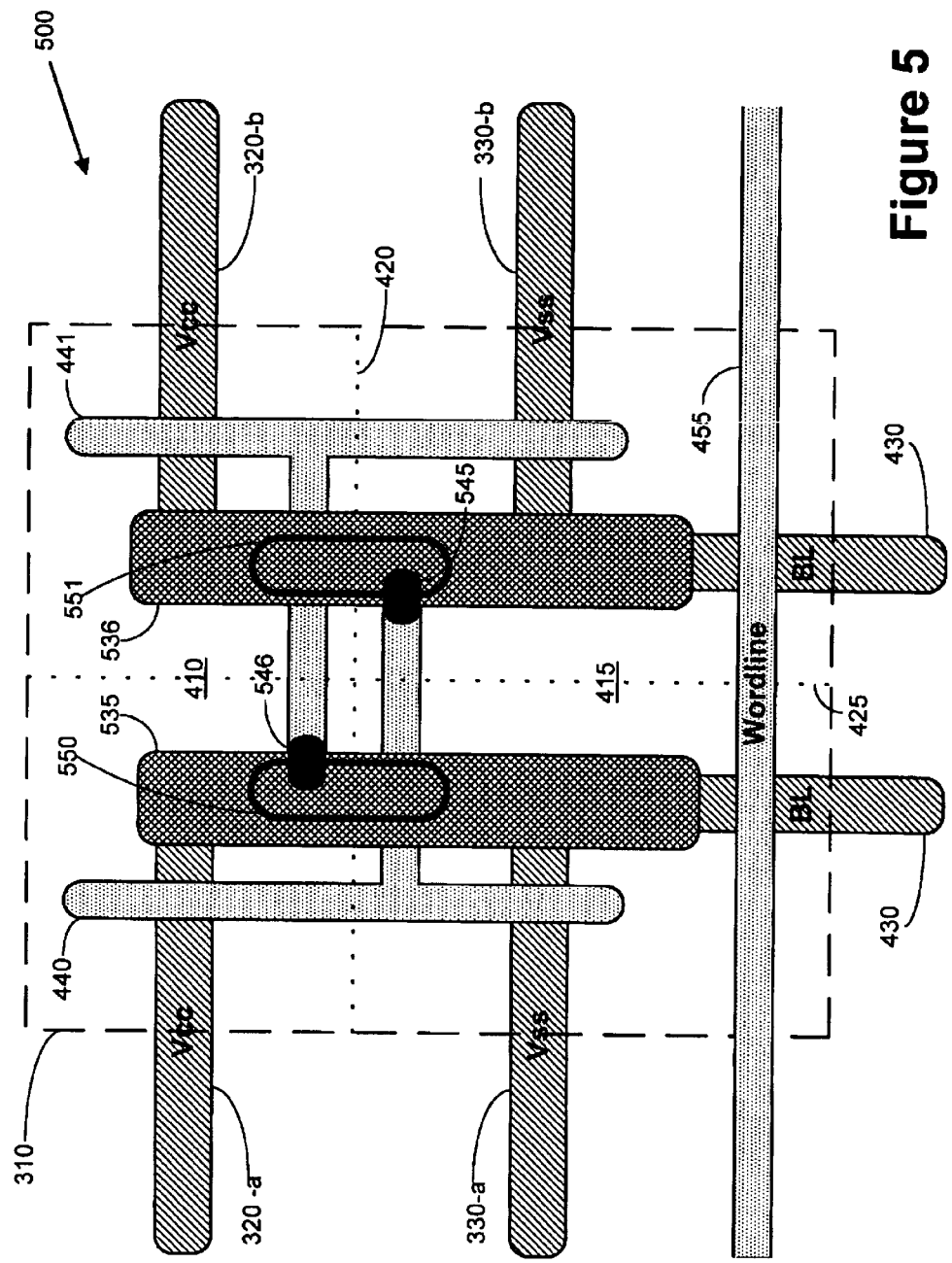
FIG. 5 illustrates a plan view of the memory cell of FIG. 3, in accordance with one illustrative embodiment of the present invention.
Figure 6:
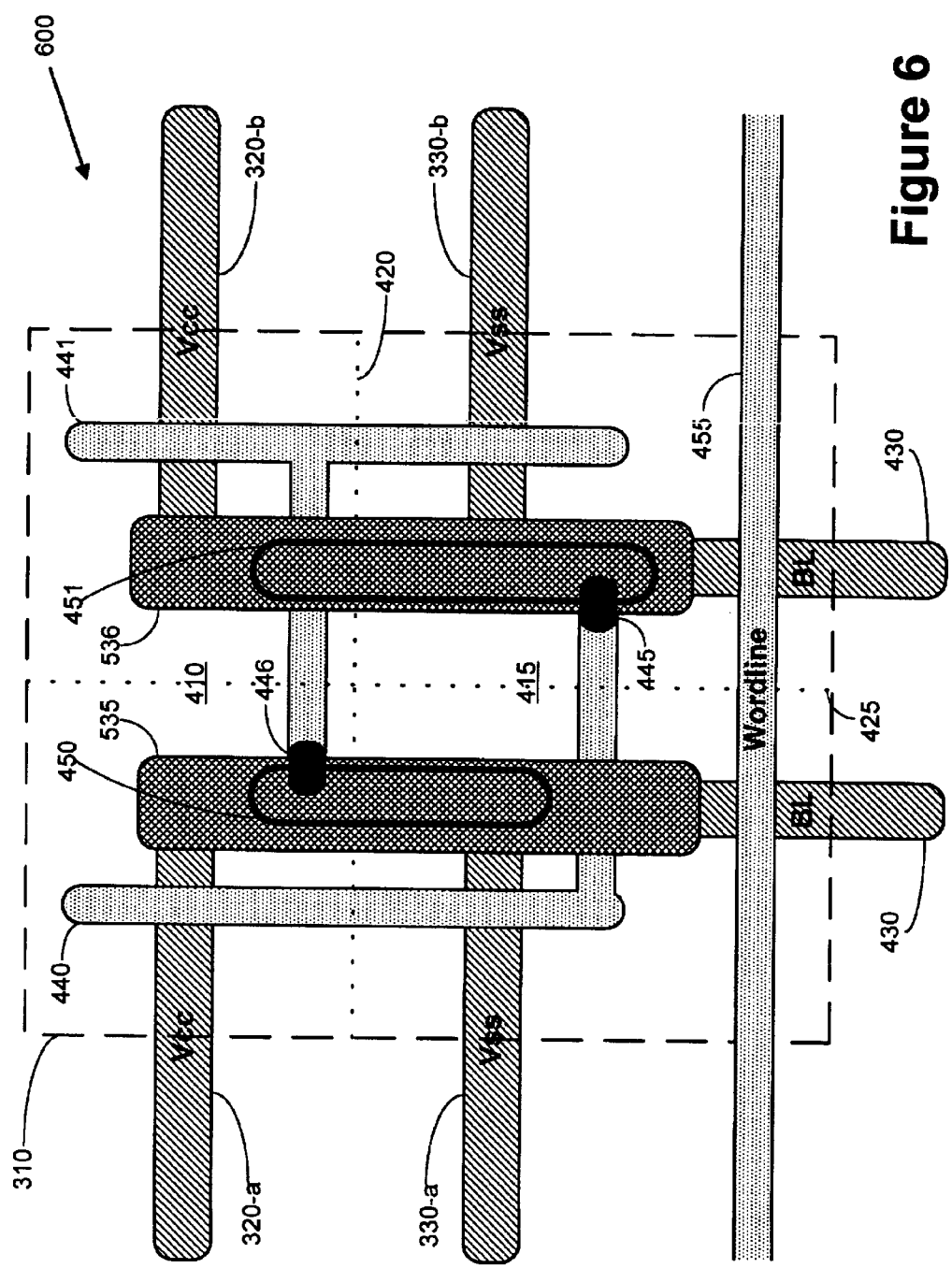
FIG. 6 illustrates a plan view of the memory cell of FIG. 3, in accordance with one illustrative embodiment of the present invention.

FIG. 5 illustrates an alternate SRAM cell layout 500, in accordance with one embodiment of the present invention. The SRAM cell layout 500 differs from the SRAM cell layout 400 in FIG. 4 in the following respects. Referring to FIG. 5, the SRAM cell 500 comprises a first active area on oxide 535 and a second active area on oxide 536 (collectively known as "active areas") located on opposing vertical sides of the SRAM cell 310. The active areas on oxide 535, 536 are larger in area than in FIG. 4. More specifically, the active areas 535, 536 are each located on both the first conductive well 410 and the second conductive well 415. The active areas on oxide 435–438 in FIG. 4, on the other hand, were each located on only the first conductive well 410 or the second conductive well 415.

The local interconnects 550, 551 in FIG. 5 are smaller in area than the local interconnects 450, 451 in FIG. 4. The first local interconnect 550 and the second local interconnect 551 are located on opposing vertical sides of the SRAM cell 310. The first local interconnect 550 is located substantially within the area of the first active area 535. The second local interconnect 551 is substantially located within the area of the second active area 536. The two EC contacts 445, 446 in FIG. 4 are now shown as respective parasitic capacitors 545, 546. The parasitic capacitors 545, 546 are shown in a T-shaped formation in FIG. 5. In one embodiment, as illustrated more clearly by the SRAM cell layout 600 in FIG. 6, at least one parasitic capacitor 545, 546 may form an L-shaped formation. Other formations may be implemented due to a variety of reasons, such as ease of process and remain within the scope of the present invention. Among other advantages known to one of ordinary skill in the art having benefit of the present invention, the parasitic capacitors 545, 546 increase capacitance without substantially increasing the junction capacitance area. The result is a lower soft error rate. Like the SRAM cell layout 400 in FIG. 4, the SRAM cell layout 500 of FIG. 5 and the SRAM cell layout 600 of FIG. 6 also benefit from lower junction leakage.

Figure 7:
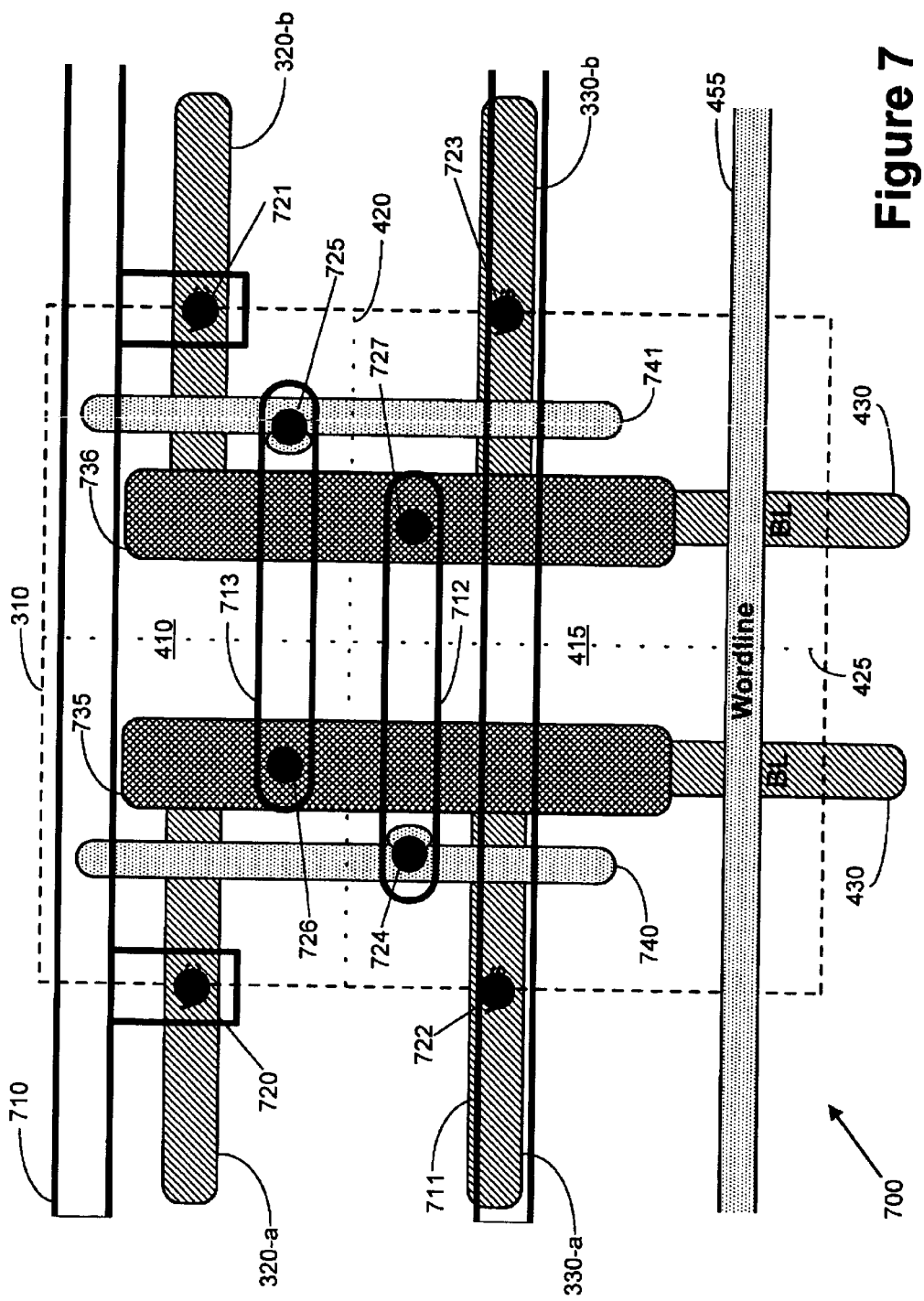
FIG. 7 illustrates a plan view of the memory cell of FIG. 3, in accordance with one illustrative embodiment of the present invention.

FIG. 7 illustrates yet another SRAM cell layout 700, in accordance with one embodiment of the present invention. The SRAM cell layout 700 differs from the SRAM cell layout 400 in FIG. 4 in the following respects. Referring to FIG. 7, the SRAM cell layout 700 further comprises a plurality of standard contacts. Unlike the EC contacts 445, 446 in FIGS. 4, 5 (parasitic capacitors 545, 546), and 6, standard contacts in FIG. 7 are formed without opening the capping layer prior to filling a contact opening with interlayer dielectric material. The SRAM cell layout 700 comprises a first shared standard contact (hereinafter "shared contact") 720 located on the $V_{cc}$ 320-a, a second shared standard contact 721 located on the $V_{cc}$ 320-b, a third shared standard contact 722 located on the $V_{ss}$ 330-a, and a fourth shared standard contact 723 located on the $V_{ss}$ 330-b. The SRAM cell 700 further comprises a first standard contact 724 located on a first gate 740 in the second conductive well 415, a second standard contact 725 located on a second gate 741 in the first conductive well 410, a third standard contact 726 located on a first active area 735 in the first conductive well 410, and a fourth standard contact 727 located on a second active area 736 in the second conductive well 415. It is appreciated that the first and second active areas 735, 736 in FIG. 7 are each substantially located on both the first conductive well 410 and the second conductive well 415.

The SRAM cell layout 700 comprises a plurality of metal interconnects, instead of the local interconnects 450, 451 of FIG. 4. A metal interconnect differs from the local interconnect 450, 451 in that the metal interconnect is not necessarily self-aligned. Furthermore, the metal interconnect may be formed above the gates 740, 741, and not necessarily in the same layer. In one embodiment, the metal interconnects include local interconnects 450, 451 of FIG. 4. A first metal interconnect 710 connects the first shared standard contact 720 and the second shared standard contact 721. A second metal interconnect 711 connects the third shared standard contact 722 and the fourth shared standard contact 723. A third metal interconnect 712 connects the first standard contact 724 and the fourth standard contact 727. A fourth metal interconnect 713 connects the second standard contact 725 and the third standard contact 726. This concludes the description of the SRAM cell structure.

Figure 8:
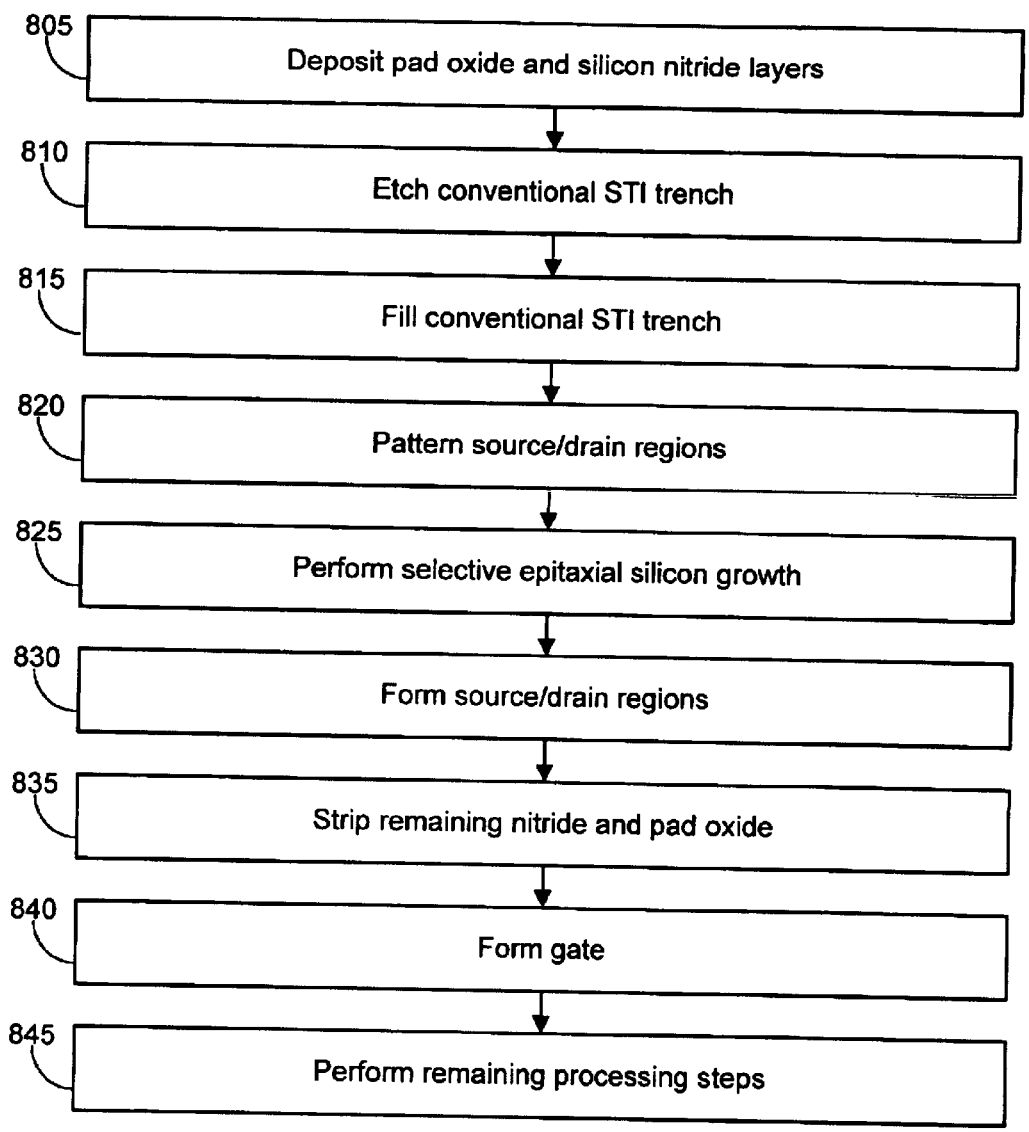
FIG. 8 illustrates a flowchart depiction of a method of fabricating the memory cell of FIGS. 4–7, in accordance with one illustrative embodiment of the present invention.
Figure 9A:
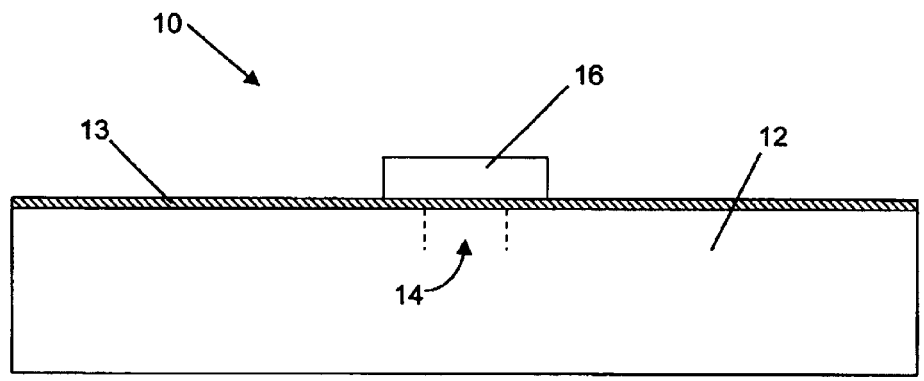
FIGS. 9A–9J are sectional views of the fabrication of the memory cell of FIGS. 4–7, in accordance with one illustrative embodiment of the present invention.

A method of forming the SRAM cell 310 in accordance with embodiments of the present invention is described below in FIGS. 8 and 9A–9J inclusive. Referring to FIG. 8, layers of pad oxide and nitride are deposited (at 805) on the bulk semiconductor substrate. As illustrated in FIG. 9A, substrate 10 comprises a bulk semiconductor substrate 12. In one embodiment, the bulk semiconductor substrate 12 is a monocrystalline material, such as monocrystalline silicon lightly doped with p-type material. As used in this document, the term "bulk" also includes doped well regions within such substrates. Bulk semiconductor substrate 12 comprises a channel region 14, which is shown as being masked by a pad oxide layer 13 and a patterned block of masking material 16. The channel region 14 may be formed by using photolithography processes, for example. For an exemplary 0.15 micron transistor gate width, an exemplary thickness for the pad oxide layer 13 is 100 Angstroms. An exemplary preferred material for masking material 16 is silicon nitride deposited to an exemplary thickness of 900 Angstroms. An exemplary width is 0.25 micron. In the illustrated embodiment, masking material 16 extends laterally beyond the lateral confines of the channel region 14. Such provides but one example of forming a channel region 14 within the bulk semiconductive material of a semiconductor substrate 12, and of masking the same.

Figure 9B:
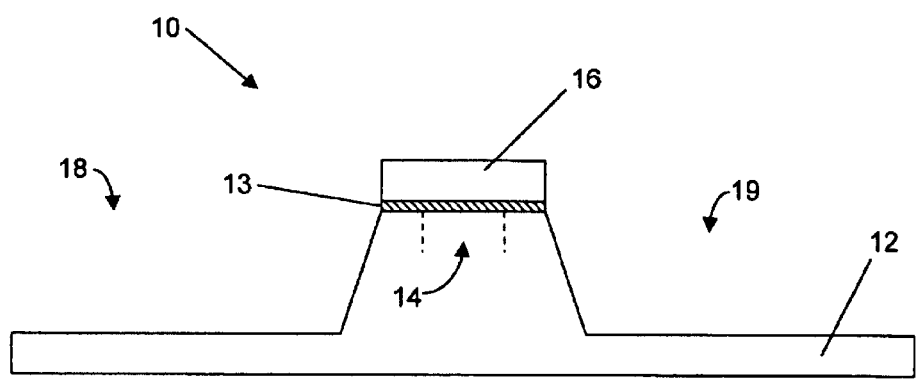

Referring again to FIG. 8, a conventional shallow trench isolation structure (STI) is etched (at 810). As illustrated in FIG. 9B, at least one trench is formed into the bulk semiconductor substrate 12 on at least one side of the channel region 14 received within the bulk semiconductor substrate 12. Preferably and as shown, two trenches 18, 19 are formed into the bulk semiconductor substrate 12 on opposing sides of the channel region 14. Such preferably occurs by an existing or yet-to-be developed substantially anisotropic etching technique. An exemplary preferred depth for the trench etching is 1700 Angstroms.

Figure 9C:
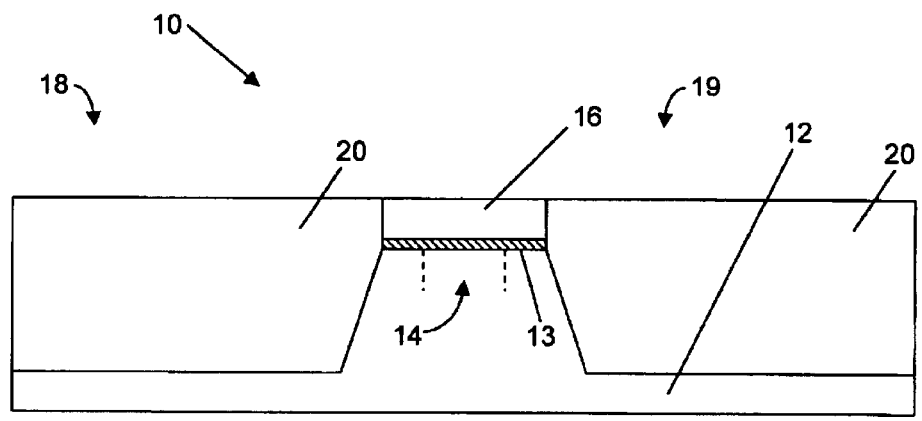

Referring again to FIG. 8, the conventional STI trench is filled (at 815). As illustrated in FIG. 9C, a dielectric (or insulative) material 20 is deposited over masking material 16 and within and overfilling trenches 18, 19. Exemplary and preferred processing includes sidewall oxidation either before or after deposition of the dielectric material 20. For a further embodiment, the sidewall oxidation may be performed prior to formation of the masking material 16. In one embodiment, the dielectric material 20 is high-density plasma deposited oxide. The dielectric material 20 is preferably initially deposited to overfill the trenches 18, 19 and then subsequently planarized at least to the masking material 16 to provide the construction as illustrated in FIG. 9C. Exemplary planarizing techniques include chemical-mechanical polishing ("CMP") and resist etch-back.

Figure 9D:
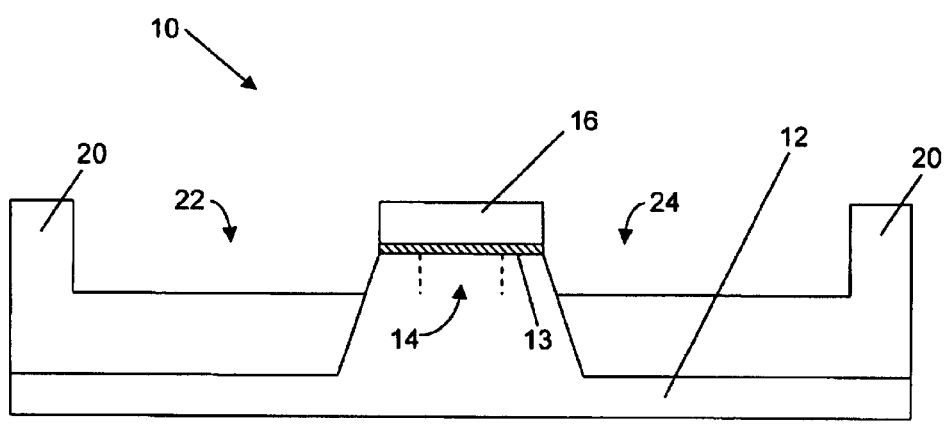

Referring again to FIG. 8, the source/drain regions are patterned (at 820). As illustrated in FIG. 9D, portions of dielectric material 20 are removed from within trenches 18, 19 effective to form at least one and preferably two source/drain voids 22, 24 on the respective sides of channel region 14. Such removal as shown is preferably effective to expose bulk semiconductive substrate 12. An exemplary preferred depth of the source/drain voids 22, 24 within dielectric material 20 is 1500–2000 Angstroms, or a depth sufficient to expose approximately 500–1000 Angstroms of the bulk semiconductive substrate 12. In one embodiment, the removal technique is a timed anisotropic etch with a photolithographic patterned mask being received over the non-etched portions of the dielectric material 20. In the illustrated embodiment, such effectively defines the outlines of the source/drain voids 22, 24 of the FETs being formed. Preferably and as shown, such removing forms an outer surface of dielectric material 20 to be planar at the base of the source/drain voids 22, 24.

Figure 9E:
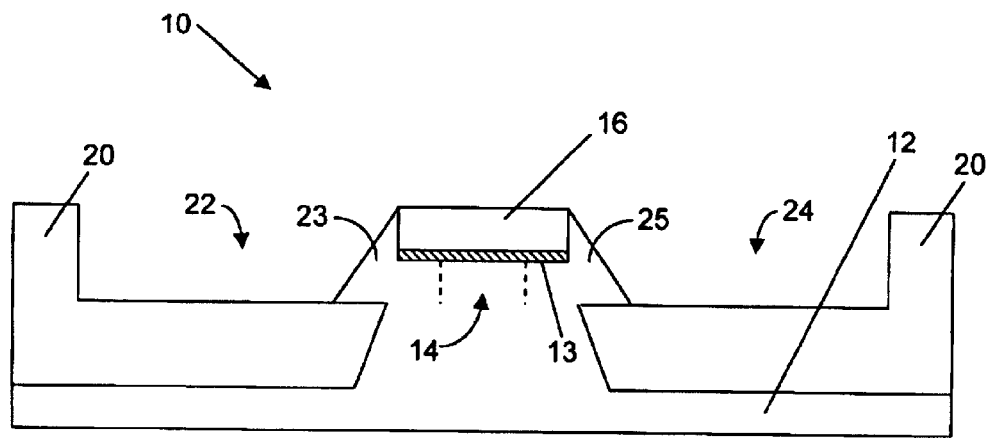

Referring again to FIG. 8, selective epitaxial growth is performed (at 825). As illustrated in FIG. 9E, an epitaxial silicon growth, or deposition is performed. Epitaxial silicon growth will be selective to portions of the bulk semiconductive substrate 12 exposed by the source/drain voids 22, 24. The epitaxial silicon will grow both horizontally and vertically from the exposed portions of the bulk semiconductive substrate 12. Such selective growth will produce extension of bulk semiconductive material 23, 25 in source/drain voids 22, 24. The extensions of bulk semiconductive material 23, 25 will move the gate boundary away from the channel region 14, thus facilitating a reduction in potential source/drain junction leakage.

Epitaxial deposition of silicon is a chemical vapor deposition ("CVD") process used to produce a layer of single crystal material upon a surface of a single crystal substrate. Silicon precursors are transported to, and absorbed on, the surface of the substrate 10. Common silicon precursors for the production of epitaxial silicon as the single crystal material include silicon tetrachloride ($SiCl_4$), trichlorosilane ($SiHCl_3$), dichlorosilane ($SiH_2Cl_2$), and silane ($SiH_4$). The chemical reaction to produce monocrystalline silicon proceeds preferentially on exposed monocrystalline silicon where nucleation is favored, with the newly formed silicon providing an advancing reaction interface and new nucleation sites.

The process of epitaxial silicon growth is well understood in the art. Typical deposition temperatures range from about 600° C. to about 1250° C. Depth of the epitaxial growth is typically controlled through reaction time, or time that the substrate 10 is exposed to the reactant gases and their reaction conditions. Typical reaction times may range from about one minute to about fifteen minutes or more, depending upon the desired depth. For one embodiment, the extension of bulk semiconductor material 23, 25 have a maximum depth of approximately 1000 Angstroms. In another embodiment, the epitaxial silicon growth may be carried out to fill the source/drain voids 22, 24 with bulk semiconductor material.

Selective epitaxial deposition occurs when silicon atoms having high surface mobility are deposited from the silicon source or precursor. These silicon atoms migrate to sites on the single crystal material where nucleation is favored. Others have observed that silicon mobility is enhanced by the presence of halides in the reaction gases. Other factors recognized to enhance the selective nature of the silicon deposition include reduced reaction pressure, increased reaction temperature, and decreased mode fraction of silicon in the reaction gases. Some polysilicon growth may occur concurrently with the epitaxial growth due to reactions occurring on non-monocrystalline surfaces (e.g., exposed surfaces of the dielectrial material 20). However, epitaxial growth on the exposed portions of the bulk semiconductor substrate 12 should be the dominant reaction.

In one embodiment, the epitaxial silicon growth is undoped monocrystalline silicon. In another embodiment, the epitaxial silicon growth is doped monocrystalline silicon. Doping of the epitaxial silicon growth can be used to alter the conductive properties of the resulting monocrystalline silicon, to reduce the temperature of formation or to otherwise alter the properties of the resulting material. The dopants, or impurities, are added to the reaction gases during the epitaxial silicon growth. Doping epitaxial growth is typically carried out by adding hydrides of the dopant materials to the reaction gases. For example, diborane ($B_2H_6$) may be added to the reaction gases to form a boron-doped bulk semiconductor material. For one embodiment, the epitaxial silicon growth is doped with germanium (Ge). For a further embodiment, the doping is carried out using germanium tetrahydride (GeH$_4$). For a still further embodiment, the epitaxial silicon growth is a growth of silicon-germanium (Si$_x$Ge$_{1-x}$) allow. Silicon-germanium alloy can be grown exponentially on silicon. For one embodiment, the silicon-germanium alloy contains approximately 20% germanium or more (e.g., 0<=x<=0.8). For a further embodiment, the silicon-germanium alloy further contains no more than approximately 50% germanium (e.g., 0.5<=x<=0.8).

Figure 9F:
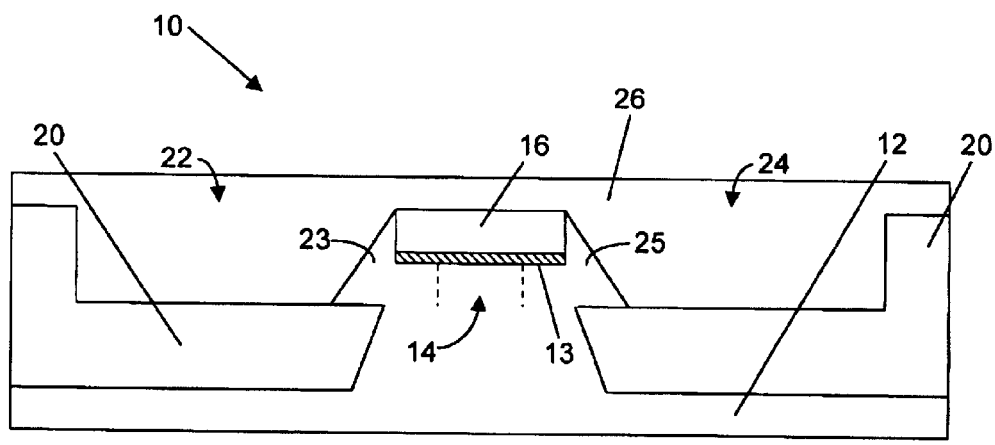

Referring to FIG. 8, the source/drain regions (30, 32 in FIG. 9H) are formed (at 830). As illustrated in FIG. 9F, a source/drain semiconductive material 26 is formed within the source/drain voids 22, 24. In one embodiment, the material 26 is polycrystalline material. For example, the material may be polycrystalline silicon, preferably in situ conductively doped with a conductivity enhancing impurity during a chemical vapor deposition ("CVD"). The conductivity type for the source/drain semiconductor material 26 is chosen to be a type opposite that of the bulk semiconductor substrate 12. For a p-type bulk semiconductor substrate 12, an n-type impurity would generally be used for the source/drain semiconductive material 26. Similarly, for an n-type bulk semiconductor substrate 12, a p-type impurity would generally be used for the source/drain semiconductive material 26. The source/drain semiconductive material 26 preferably covers and physically contacts the extensions of bulk semiconductor material 23, 25.

Figure 9G:
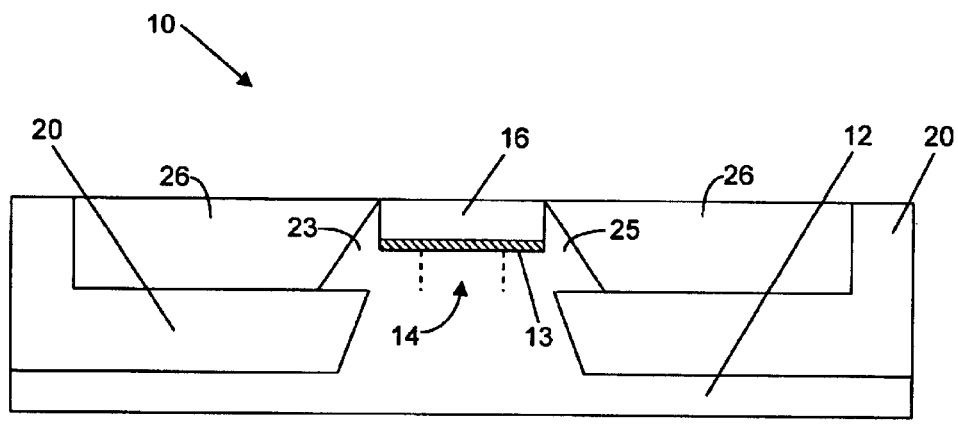

Referring to FIG. 9G, deposited source/drain semiconductive material 26 is planarized to at least the masking material 16. As mentioned above, exemplary and preferred planarization techniques include CMP and resist etch-back.

Figure 9H:
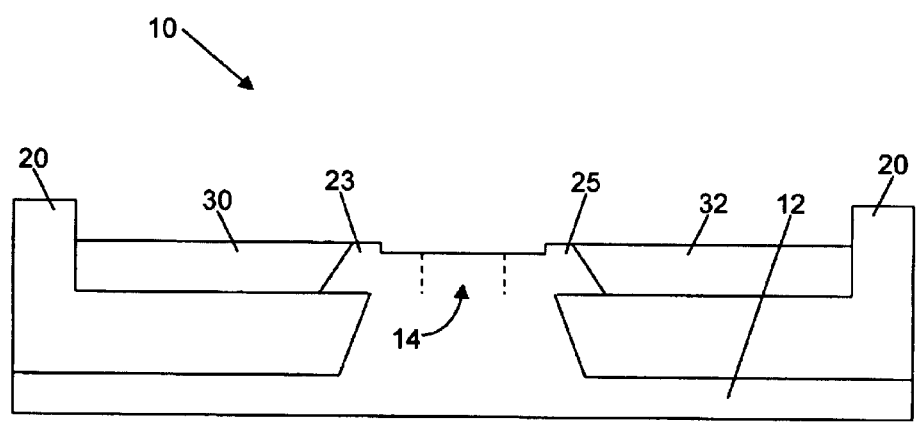

Referring again to FIG. 8, the remaining nitride and pad oxide layers are stripped (at 835). As illustrated in FIG. 9H, channel region 14 is unmasked preferably by etching away all of the masking material 16 and all of the pad oxide layer 13 of FIG. 9G. Furthermore, preferably as shown, some and only some of the source/drain semiconductive material 26 of FIG. 9G is etched from the substrate 10. Such might occur in one or more etching steps depending on the chemistry utilized and the desires of the processor, as readily determinable by the artisan. An exemplary etch chemistry that will etch polysilicon and silicon nitride in a substantially nonselective manner includes plasma CF$_4$, Ch$_2$F$_2$, and He. In the illustrated embodiment, the preferred amount of source/drain semiconductive material 26 left is 900 Angstroms thick. Such provides but one example of forming source/drain regions 30, 32, which are also preferably substantially planar. The resulting step between the upper surface of the dielectric material 20 and the upper surfaces of the source/drain regions 30, 32 is preferably reduced, if necessary, to between approximately 200–300 Angstroms. Such can be accomplished, for example, with a simple hydrofluoric acid (HF) clean.

Figure 9I:
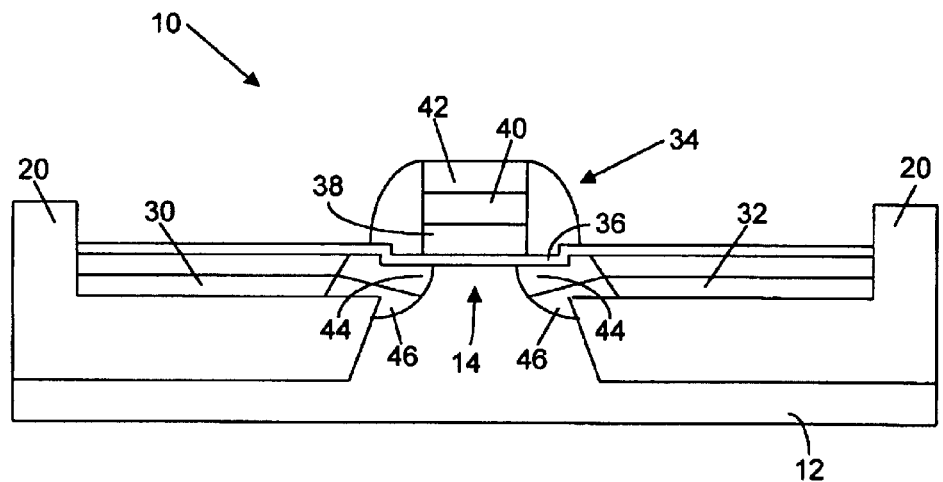

Referring again to 8, a gate stack 34 is formed (at 840). As illustrated in FIG. 9I, a gate stack 34 is formed over channel region 14. Preferably as shown, a gate dielectric layer 36, for example silicon dioxide, is first formed over channel region 14. A gate stack 34 is then formed over channel region 14. For one embodiment, the gate stack 34 includes a conductively doped polysilicon layer 38 and a conductive silicide layer 40 (for example Wsi$_x$) and a nitride capping layer 42. Thereafter, at least one pocket implanting is conducted to provide at least one pocket implant region intermediate the source/drain semiconductive material 26 and the channel region 14. In the illustrated and preferred example, exemplary pocket implants include source/drain extension ("SDE") implant regions 44 having a thickness of approximately 500 Angstroms, and halo implant regions 46 provided therebeneath having an approximate thickness of 500 Angstroms and to extend below the source/drain regions 30, 32. Insulative spaces are subsequently added, as shown. Rapid thermal processing is preferably conducted at some point, as is conventional.

Figure 9J:
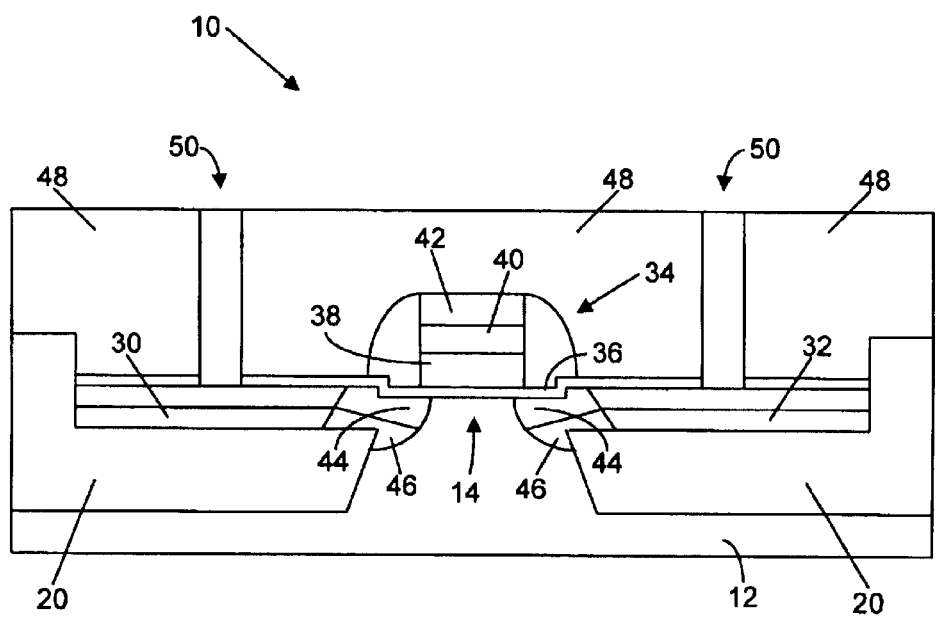

Referring again to FIG. 8, the remaining processing steps are performed (at 845) as is known in conventional practice. Referring to FIG. 9J, subsequent exemplary processing is illustrated. Depicted is the provision and planarizing of a dielectric layer 48, for example, borophosphosilicate glass (BPSG). Contact openings have been formed therethrough and plugged with conductive material to form source/drain contacts 50.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory device comprising a memory cell, the memory cell comprising:
   a first active area on oxide in a first conductive well located on a first vertical side of the memory cell;
   a second active area on oxide in a second conductive well located on the first vertical side of the memory cell;
   a third active area on oxide in the first conductive well located on a second vertical side of the memory cell;
   a first bitline operatively coupled to said third active area on oxide;
   a fourth active area on oxide in the second conductive well located on the second vertical side of the memory cell;
   a second bitline operatively coupled to said fourth active area on oxide;
   a first gate located on the first vertical side of the memory cell;
   a second gate located on the second vertical side of the memory cell;
   a first local interconnect connecting the first active area, the second active area, and the second gate via a second EC contact located on the second gate; and
   a second local interconnect connecting the third active area, the fourth active area, and the first gate via a first EC contact located on the first gate.

2. The memory device of claim 1, wherein said memory device is an SRAM device.

3. The memory device of claim 1, wherein the first gate and the second gate are T-shaped.

4. The memory device of claim 1, further comprising a wordline.

5. The memory device of claim 1, further comprising a plurality of bitlines connected to complimentary bitline contacts.

6. An SRAM cell, comprising:
   a first active area on oxide in a first conductive well located on a first vertical side of the SRAM cell;

a second active area on oxide in a second conductive well located on the first vertical side of the SRAM cell;
a third active area on oxide in the first conductive well located on a second vertical side of the SRAM cell;
a first bitline operatively coupled to said third active area on oxide;
a fourth active area on oxide in the second conductive well located on the second vertical side of the SRAM cell;
a second bitline operatively coupled to said fourth active area on oxide;
a first gate located on the first vertical side of the SRAM cell;
a second gate located on the second vertical side of the SRAM cell;
a first local interconnect connecting the first active area, the second active area, and the second gate via a second EC contact located on the second gate; and
a second local interconnect connecting the third active area, the fourth active area, and the first gate via a first EC contact located on the first gate.

7. The SRAM cell of claim 6, wherein the first gate and the second gate are T-shaped.

8. The SRAM cell of claim 6, further comprising a ground reference voltage (Vss) for providing a ground connection to the SRAM cell.

9. The SRAM cell of claim 6, further comprising a voltage supply (Vcc) for providing power to the SRAM cell.

10. The SRAM cell of claim 6, further comprising a wordline.

11. The SRAM cell of claim 6, further comprising a plurality of bitlines connected to complimentary bitline contacts.

12. An SRAM cell, comprising:
a first active area on oxide in a first and second conductive well located on a first vertical side of the SRAM cell;
a second active area on oxide in the first and second conductive well located on the second vertical side of the SRAM cell;
forming a first bitline operatively coupled to said first active area on oxide;
forming a second bitline operatively coupled to said second active area on oxide;
a first gate located on the first vertical side of the SRAM cell;
a second gate located on the second vertical side of the SRAM cell;
a first local interconnect connecting the first active area and the second gate via a second EC contact located on the second gate; and
a second local interconnect connecting the second active area to the first gate via a first EC contact located on the first gate; and
wherein the first gate and second gate comprise parasitic capacitors.

13. The SRAM cell of claim 12, wherein the first gate and the second gate are T-shaped.

14. The SRAM cell of claim 12, wherein one of the first gate and the second gate is L-shaped.

15. A SRAM cell, comprising:
a first shared standard contact located in a first conductive well on a first vertical side of the SRAM cell;
a second shared standard contact located in the first conductive well on a second vertical side of the SRAM cell;
a first metal interconnect connecting the first shared standard contact and the second shared standard contact;
a third shared standard contact located in a second conductive well on the first vertical side of the SRAM cell;
a first bitline operatively coupled to said third shared standard contact;
a fourth shared standard contact located in the second conductive well on the second vertical side of the SRAM cell;
a second bitline operatively coupled to said fourth shared standard contact;
a second metal interconnect connecting the third shared standard contact and the fourth shared standard contact;
a first standard contact located on a first gate in the second conductive well;
a second standard contact located on a second gate in the first conductive well;
a third standard contact located on a first active area on oxide in a first conductive well;
a fourth standard contact located on a second active area on oxide in a second conductive well;
a third metal interconnect connecting the first standard contact and the fourth standard contact; and
a fourth metal interconnect connecting the third standard contact and the second standard contact.

16. A system, comprising:
a memory unit comprising at least one memory cell, said memory cell comprising:
a first active area on oxide in a first conductive well located on a first vertical side of the memory cell;
a second active area on oxide in a second conductive well located on the first vertical side of the memory cell;
a third active area on oxide in the first conductive well located on a second vertical side of the memory cell;
a first bitline operatively coupled to said third active area on oxide;
a fourth active area on oxide in the second conductive well located on the second vertical side of the memory cell;
a second bitline operatively coupled to said fourth active area on oxide;
a first gate located on the first vertical side of the memory cell;
a second gate located on the second vertical side of the memory cell;
a first local interconnect connecting the first active area, the second active area, and the second gate via a second EC contact located on the second gate;
a second local interconnect connecting the third active area, the fourth active area, and the first gate via a first EC contact located on the first gate; and
an access unit coupled to the memory unit, said access unit capable of accessing at least a portion of the memory unit.

17. The system of claim 16, wherein the first gate and the second gate are T-shaped.

18. The system of claim 16, further comprising a ground reference voltage (Vss) for providing a ground connection to the memory cell.

19. The system of claim 16, further comprising a voltage supply (Vcc) for providing power to the memory cell.

20. The system of claim 16, further comprising a wordline.

21. The system of claim 16, further comprising a plurality of bitlines connected to complimentary bitline contacts.

22. A method for forming a memory cell, comprising:
forming a first active area on oxide in a first conductive well located on a first vertical side of the memory cell;
forming a second active area on oxide in a second conductive well located on the first vertical side of the memory cell;
forming a third active area on oxide in the first conductive well located on a second vertical side of the memory cell;
forming a first bitline, said first bitline being operatively coupled to said third active area on oxide;
forming a fourth active area on oxide in the second conductive well located on the second vertical side of the memory cell;
forming a second bitline operatively coupled to said fourth active area on oxide;
forming a first gate on the first vertical side of the memory cell;
forming a second gate on the second vertical side of the memory cell;
forming a first local interconnect to connect the first active area, the second active area, and the second gate via a second EC contact located on the second gate; and
forming a second local interconnect to connect the third active area, the fourth active area, and the first gate via a first EC contact located on the first gate.

23. The method of claim 22, wherein forming the first gate and the second gate comprises forming the first gate and the second gate in a T-shape.

24. The method of claim 22, further comprising forming a wordline in the memory cell.

25. The method of claim 22, further comprising forming a plurality of bitlines connected to complimentary bitline contacts associated with said memory cell.

26. The method of claim 22, wherein forming said memory cell further comprising:
depositing a pad oxide layer and a silicon nitride layer on a substrate;
etching a shallow trench isolation (STI) structure above said pad oxide and silicon nitride layers;
filling the STI structure;
patterning a source region and a drain region;
performing a selective epitaxial silicon growth;
forming said source and drain regions;
stripping excess silicon nitride and pad oxide materials; and
forming a gate region.

27. A method for forming a memory cell, comprising:
forming a first active area on oxide in a first and second conductive well located on a first vertical side of the memory cell;
forming a second active area on oxide in the first and second conductive well located on the second vertical side of the memory cell;
forming a first bitline operatively coupled to said first active area on oxide;
forming a second bitline operatively coupled to said second active area on oxide;
forming a first gate on the first vertical side of the memory cell;
forming a second gate on the second vertical side of the memory cell;
forming a first local interconnect to connect the first active area and the second gate via a second EC contact located on the second gate;
forming a second local interconnect to connect the second active area to the first gate via a first EC contact located on the first gate; and
wherein the first gate and second gate are formed to comprise parasitic capacitors.

28. A method for forming a memory cell, comprising:
forming a first shared standard contact in a first conductive well on a first vertical side of the memory cell;
forming a second shared standard contact in the first conductive well on a second vertical side of the memory cell;
forming a first metal interconnect to connect the first shared standard contact and the second shared standard contact;
forming a third shared standard contact in a second conductive well on the first vertical side of the memory cell;
forming a first bitline operatively coupled to said third shared standard contact;
forming a fourth shared standard contact in the second conductive well on the second vertical side of the memory cell;
forming a second bitline operatively coupled to said fourth shared standard contact;
forming a second metal interconnect to connect the third shared standard contact and the fourth shared standard contact;
forming a first standard contact on a first gate in the second conductive well;
forming a second standard contact on a second gate in the first conductive well;
forming a third standard contact on a first active area on oxide in a first conductive well;
forming a fourth standard contact on a second active area on oxide in a second conductive well;
forming a third metal interconnect to connect the first standard contact and the fourth standard contact; and
forming a fourth metal interconnect to connect the third standard contact and the second standard contact.

29. A system board comprising:
a processor; and
a memory device operatively coupled to said processor, the memory device comprising a memory cell that comprises:
a first active area on oxide in a first conductive well located on a first vertical side of the memory cell;
a second active area on oxide in a second conductive well located on the first vertical side of the memory cell;
a third active area on oxide in the first conductive well located on a second vertical side of the memory cell;
a first bitline operatively coupled to said third active area on oxide;
a fourth active area on oxide in the second conductive well located on the second vertical side of the memory cell;
a second bitline operatively coupled to said fourth active area on oxide;
a first gate located on the first vertical side of the memory cell;
a second gate located on the second vertical side of the memory cell;

a first local interconnect connecting the first active area, the second active area, and the second gate via a second EC contact located on the second gate; and a second local interconnect connecting the third active area, the fourth active area, and the first gate via a first EC contact located on the first gate.

30. The system board of claim 29, wherein said memory device is a SRAM device.

31. The system board of claim 29, further comprising a wordline.

32. The system board of claim 29, further comprising a plurality of bitlines connected to complimentary bitline contacts.

33. A memory cell comprising:

an oxide layer;

a bulk semiconductor substrate;

a first semiconductor device including a first gate, a first channel region in the bulk semiconductor substrate; and first source/drain regions on the oxide layer on opposing sides of the first channel region; and a second semiconductor device including a second gate, a second channel region in the bulk semiconductor substrate, and second source/drain regions on opposing sides of the second channel region, wherein the second gate couples the first source/drain regions and the first gate couples the second source/drain regions.

34. The memory cell of claim 33, wherein the memory device is an SRAM device.

35. The memory cell of claim 33, wherein the bulk semiconductor substrate comprises monocrystalline silicon.

36. The memory cell of claim 33, further comprising:

a first epitaxial silicon interposed between the first channel region and the first source/drain regions; and a second epitaxial silicon interposed between the second channel region and the second source/drain regions.

37. The memory cell of claim 33, further comprising:

a first interconnect connecting the first source/drain regions and the second gate via a second contact; and a second interconnect connecting the second source/drain regions and the first gate via a first contact.

38. The memory cell of claim 33, further comprising:

a first bit-line operatively coupled to one of the first source/drain regions; and a second bit-line operatively coupled to one of the second source/drain regions.

39. A SRAM cell comprising:

a first silicon device including a first channel region in a monocrystalline silicon substrate, a first polycrystalline silicon active region on an oxide layer on a first side of the first channel region, a second polycrystalline silicon active region on a second side of the first channel region, and a first gate overlaying the first channel region; and a second silicon device coupled to the first silicon device, the second silicon device including a second channel region in the monocrystalline silicon substrate, third polycrystalline silicon active region on the oxide layer on a first side of the second channel region, a fourth polycrystalline silicon active region on a second side of the second channel region, and a second gate overlaying the second channel region, wherein the first gate couples the third and fourth polycrystalline silicon active regions and the second gate couples the first and second polycrystalline silicon active regions.

40. The SRAM cell of claim 39, further comprising:

a first local interconnect connecting the first polycrystalline silicon active region, the second polycrystalline silicon acitve region, and the second gate via a second EC contact; and a second local interconnect connecting the third polycrystalline silicon active region, the fourth polycrystalline silicon active region, and the first gate via a first EC contact.

41. The SRAM cell of claim 39, further comprising:

a first epitaxial silicon interposed between the first channel region and the first and second polycrystalline silicon active regions; and a second epitaxial silicon interposed between the second channel region and the third and fourth polycrystalline silicon active regions.

42. The SRAM cell of claim 39 further comprising:

a first bitline operatively coupled to the second polycrystalline silicon active region; and a second bitline operatively coupled to the fourth polycrystalline silicon active region.

43. The SRAM cell of claim 42, further comprising:

a wordline, wherein the first gate and the second gate are T-shaped.

44. A method of forming a memory cell comprising:

forming an oxide layer;

forming a bulk semiconductor substrate;

forming a first semiconductor device including a first gate, a first channel region in the bulk semiconductor substrate, and first source/drain regions on the oxide layer on opposing sides of the first channel region; and forming a second semiconductor device including a second gate, a second channel region in the bulk semiconductor substrate, and second source/drain regions on opposing sides of the second channel region, wherein the second gate couples the first source/drain regions and the first gate couples the second source/drain regions.

45. The method of claim 44, further comprising forming the first gate and the second gate in a T-shape.

46. The method of claim 44, wherein forming the bulk semiconductor substrate comprises forming monocrystalline silicon.

47. The method of claim, further comprising:

forming a first epitaxial silicon interposed between the first channel region and the first source/drain regions; and forming a second epitaxial silicon interposed between the second channel region and the second source/drain regions.

48. The method of claim 44, further comprising:

forming a first interconnect connecting the first source/drain regions and the second gate via a second contact; and forming a second interconnect connecting the second source/drain regions and the first gate via a first contact.

49. The method of claim 44, further comprising:

forming a first bit-line operatively coupled to one of the first source/drain regions; and forming a second bit-line operatively coupled to one of the second source/drain regions.

50. A method of forming a SRAM cell comprising:

forming a first silicon device including a first channel region in a moncrystalline silicon substrate, forming a second polycrystalline silicon active region on an oxide layer on a first side of the firt channel region, forming a second polycrystalline silicon active region on a second side of the first channel region, and forming a first gate overlaying the first channel region; and forming a second silicon device coupled to the first silicon device, the second silicon device including a second channel region in the monocrystalline silicon substrate, forming a third polycrystalline silicon active region on the oxide layer on a first side of the second channel region, forming a fourth polycrystalline silicon active region on a second side of the second channel region, and forming a second gate overlaying the second channel region, wherein the first gate couples the third and fourth polycrystalline silicon active regions and the second gate couples the first and second polycrystalline silicon active regions.

51. The method of forming a SRAM cell of claim 50, further comprising:

forming a first local interconnect connecting the first polycrystalline silicon active region, the second polycrystalline silicon active region, and the second gate via a second EC contact; and forming a second local interconnect connecting the third polycrystalline silicon active region, the fourth polycrystalline silicon active region, and the first gate via a first EC contact.

52. The method of forming a SRAM cell of claim 50, further comprising:

forming a first epitaxial silicon interposed between the first channel region and the first and second polycrystalline silicon active regions; and forming a second epitaxial silicon interposed between the second channel region and the third and fourth polycrystalline silicon active regions.

53. The method of forming a SRAM cell of claim 50, further comprising:

forming a first bitline operatively coupled to the second polycrystalline silicon active region; and forming a second bitline operatively coupled to the fourth polycrystalline silicon active region.

54. The method of forming a SRAM cell of claim 53, further comprising:

forming a wordline; and forming the first gate and the second gate in a T-shape.

* * * * *